United States Patent [19]

Babitzka et al.

[11] 4,382,243

[45] May 3, 1983

[54] ELECTROMAGNETIC POSITIONING DEVICE WITH PIEZO-ELECTRIC CONTROL

[75] Inventors: Rudolf Babitzka, Kirchberg; Walter Beck, Schwieberdingen, both of Fed. Rep. of Germany

[73] Assignee: Robert Bosch GmbH, Stuttgart, Fed. Rep. of Germany

[21] Appl. No.: 274,526

[22] Filed: Jun. 17, 1981

[30] Foreign Application Priority Data

Aug. 20, 1980 [DE] Fed. Rep. of Germany ....... 3031354

[51] Int. Cl.³ ........................ H01L 41/08; H01F 7/08

[52] U.S. Cl. .................................... 335/219; 310/328; 310/19; 335/258

[58] Field of Search ..................... 310/328, 14, 15, 17, 310/19, 23, 30, 34; 335/219, 258

[56] References Cited

U.S. PATENT DOCUMENTS

| | | | |
|---|---|---|---|
| 3,249,823 | 5/1966 | Beardow | 335/258 |
| 3,363,139 | 1/1968 | Schiavone | 310/328 X |
| 3,462,939 | 8/1969 | Tanaka et al. | 310/328 X |
| 3,541,849 | 11/1970 | Corbett | 310/328 X |
| 3,665,353 | 5/1972 | Campbell | 335/258 |

*Primary Examiner*—Mark O. Budd

*Attorney, Agent, or Firm*—Frishauf, Holtz, Goodman & Woodward

[57] ABSTRACT

A piezo-electric control device is used to restrain movement of the armature of an electromagnet until the current through the exciter winding of the electromagnet has reached almost the maximum value. This causes the force applied to the armature to be the maximum force from the start of movement, so that the overall time required for movement of the armature from its starting to its end position is substantially decreased. Specifically, the piezo-electric control device is a column of discs having an axis perpendicular to the axis of movement of the armature. When electrical energy is applied to the column it expands in the axial direction causing a locking member mounted on its end to engage a stop member which is part of the armature. The locking member can either push the stop member against a further rigid stop or two columns can be used to clamp the stop member between them.

8 Claims, 2 Drawing Figures

ELECTROMAGNETIC POSITIONING DEVICE WITH PIEZO-ELECTRIC CONTROL

The present invention relates to electromagnetic positioning devices and, more particularly, to devices wherein the movement of an armature is controlled in opposition to the force of a retaining spring.

BACKGROUND OF THE INVENTION

In well-known electromagnetic positioning devices, the force of a spring is applied to the armature of an electromagnet. The latter has an iron core with an exciter winding positioned relative to the armature so that the magnetic force of the electromagnet opposes the force of the spring.

In the known apparatus, the time (positioning time) required for the armature to travel from the initial to the final position is in the order of milliseconds.

The switching times required for known piezo-electric positioning devices is in the range of 10 to 100 microseconds, but the length of path which can be reliably controlled is only in the order of a small fraction of millimeters.

THE INVENTION

It is an object of the present invention to furnish a positioning system or device which allows the length of the controlled movement to be that associated with the electromagnetic devices while achieving the positioning times of the piezo-electric devices.

In accordance with the invention, a piezo-electric device is utilized to restrain the movement of the armature until a predetermined charge of electrical energy applied to the armature has taken place. Specifically, the device is timed so that the exciter current through the winding of the electromagnet has reached its maximum value before the armature is released for movement. Thus the maximum pull is immediately applied to the armature, thereby by decreasing the positioning time.

Preferably, the piezo-electric device includes a plurality of piezo-electric discs arranged in a column and connected in series to each other. One end of the column carries a locking member. When electrical energy is applied to the column, it expands in the axial direction causing the locking device to engage a member projecting from the armature, thereby preventing movement of the latter. Alternatively, two columns each having a locking member may be positioned on either side of a stop member projecting from the armature. For this embodiment, the stop member is a metal strip whose main faces face the respective stop members. When the two columns expand, the metal strip is caught between the two stop members, thereby preventing movement of the armature.

DESCRIPTION OF THE PREFERRED EMBODIMENTS

Figure 1:
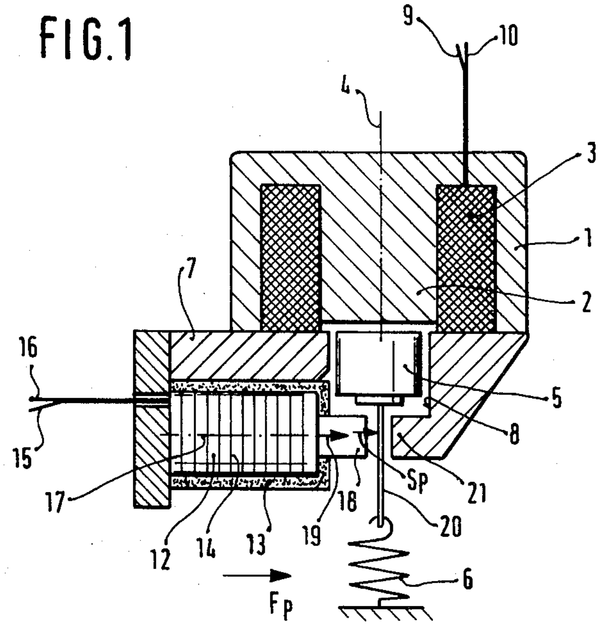
FIG. 1 is a partially sectional view of a positioning device according to the present invention.

A typical electromagnet with a pot shaped iron core 1 is shown in longitudinal section in FIG. 1. The iron core is E-shaped and has a central leg 2 on which the exciter winding 3 is formed. When viewed in the direction of longitudinal axis 4, the free face of center leg 2 faces armature 5 across a narrow gap. The apparatus guiding the movement of armature 5 is not illustrated. The force of the spring 6 is applied to armature 5. A yoke 7 having a bore 8 coaxial with longitudinal axis 4 forms the return path for the magnetic field. Armature 5 is received in bore 8 with little radial clearance.

Exciter winding 3 has winding ends 9 and 10. When DC voltage is applied to these ends, a current I begins to flow through the winding in accordance with the known equation:

$$I = \frac{U}{R}\left(1 - e^{\frac{-R}{L}t}\right),$$

Where L is the inductivity of the exciter winding, R its resistance, U the applied voltage and t the time.

It will be noted that the higher the inductivity, the slower the current increase. After the end of time constant R/L, the magnetizing current I reaches its maximum value U/R, the pull exerted by the electromagnet then being a maximum.

In accordance with the invention, armature 5 is to be restrained from movement relative to center leg 2, until magnetizing current I reaches its maximum value.

This is accomplished by a piezo electric device 12 which is mounted in an insulating housing 13 and consists of a large plurality of piezo-ceramic discs 14. These discs are electrically connected in series and may be subjected to DC voltage applied through leads 15 and 16. Due to the applied electric field, discs 14 expand in the direction of column axis 17 with simultaneous contraction in their diameter. This causes a locking member 18 mounted on one end of the column to move in the direction of arrow 19. As locking member 18 moves, it comes in contact with a stop member, namely a metal strip 20, which extends in the direction of axis 4 of the electromagnet. Metal strip 20 is rigid in the direction of axis 4 but is resilient under the pressure applied by locking or clamping member 18. It thus moves until it comes in contact with a stop 21 rigidly connected to yoke 7.

Under the conditions illustrated in FIG. 1, no voltage is being applied to the piezo-electric column. Under these conditions, the distance between strip 20 and locking member 18 on the one hand and stop 21 on the other hand consists of only a few microns. Thus the total distance Sp which must be traversed by the piezo electric device is very small, but sufficient to clamp metal strip 20 against stop 21 with a very high force Fp. The force Fp is sufficient to restrain armature 5 in the position it is in when exciter winding 3 is not energized, even after energization of the winding takes place. The magnetic field generated by exciter winding 3 can thus build up to its full strength. Only after the piezo-electric device 12 has been de-energized can the force of the magnetic field, starting at full strength, attract armature 5 in opposition to the force of the spring. The actual time of movement of armature 5 is thus substantially decreased relative to the conventional electromagnetic arrangements.

Figure 2:
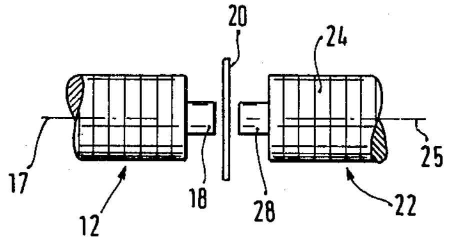
FIG. 2 is a detail of the piezo-electric control of an alternate embodiment of the present invention.

FIG. 2 illustrates a portion of a second embodiment which is similar to the first embodiment but has a second piezo-electric device 22 instead of stop 21. The second piezo-electric device also consists of a plurality of piezo-electric discs, here discs 24. There are also arranged in a column, the axis 25 of the column being positioned to form an extension of axis 17 of the first column. The second column, at the end facing metal strip 20, has a clamping or locking member 28. In other words, the second piezo-electric device is arranged with mirror symmetry to the first. This allows larger clearances to be maintained between the metal strip and locking members 18 and 28 and thus less wear due to friction of members 18 and 28 when the piezo-electric device is de-energized.

Various changes and modifications may be made within the scope of the inventive concepts.

The piezo-electric device 12 consists of some 50 piezo-ceramic discs 14 with a diameter of some 10 mm. The electric field runs up to some 1500 volts/mm, due to the applied voltage of some 700 V DC.

We claim:

1. Apparatus for preventing movement of an armature in an electromagnetic system comprising a first means (6) for applying a force in a predetermined direction to said armature and electromagnetic means (1,2,3) for applying a force to said armature to a second direction opposite said predetermined direction, said apparatus comprising a plurality of piezo electric discs (14) arranged in a column;

means (15,16) for applying electrical energy to said discs, the length of said column changing by a predetermined incremental length in response to a change in electrical energy applied thereto;

and a locking member (18) mounted on said column for movement therewith in the lengthwise direction thereof and mounted to engage said armature preventing movement thereof or be disengaged from said armature allowing movement thereof in dependence on the absence or presence of said electrical energy.

2. Apparatus as set forth in claim 1, further comprising a stop member (20) fastened to said armature for engaging said locking member when movement of said armature is restrained.

3. Apparatus as set forth in claim 2, wherein the direction of movement of said locking member is substantially perpendicular to said predetermined direction.

4. Apparatus as set forth in claim 3, wherein said stop member is a metal strip (20) projecting from said armature and having a main surface facing said locking member.

5. Apparatus as set forth in claim 4, wherein said metal strip is resilient in the direction transverse to said predetermined direction.

6. Apparatus as set forth in claim 4, wherein said metal strip has a first main surface facing said locking member and a second main surface facing in the direction opposite thereto;

further comprising end stop means (21) positioned opposite said second main surface for limiting movement thereof in the direction of resiliency.

7. Apparatus as set forth in claim 4, wherein said plurality of piezo-electric discs comprises a first plurality of discs;

further comprising a second plurality of piezo-electric discs arranged to constitute a second column, means for applying electrical energy to said second column, and a second stop member arranged for movement with said second column in the axial direction thereof; and wherein said first and second locking members engage said metal strip when said armature movement is to be restrained.

8. Positioning device comprising electromagnetic means comprising an exciter winding and armature means movable in the first predetermined direction in response to magnetic force generated by said exciter winding upon passage of current therethrough;

means for applying electrical energy to said exciter winding, whereby said current through said exciter winding increases slowly to a predetermined maximum value;

means for applying a force to said armature means opposing said magnetic force generated by said exciter winding;

and piezo-electric control means having a first and second predetermined dimension in a second predetermined direction when the electrical energy applied thereto has a first and second predetermined value, respectively; and mounted relative to said armature means to allow and prevent movement thereof when said electrical energy applied thereto has said first and second predetermined value, respectively; and wherein said second predetermined value of electrical energy is applied to said piezo-electric control means during said current increase in said exciter winding so that said armature means is only released for movement when said current through said exciter winding has reached a predetermined minimum value.

* * * * *